(12) United States Patent
Swillam et al.

(10) Patent No.: US 12,140,872 B2
(45) Date of Patent: Nov. 12, 2024

(54) OPTICAL DESIGNS OF MINIATURIZED OVERLAY MEASUREMENT SYSTEM

(71) Applicant: ASML Holding N.V., Veldhoven (NL)

(72) Inventors: Mohamed Swillam, Wilton, CT (US);
Tamer Mohamed Tawfik Ahmed Mohamed Elazhary, New Canaan, CT (US); Stephen Roux, New Fairfield, CT (US); Yevgeniy Konstantinovich Shmarev, Campbell, CA (US)

(73) Assignee: ASML Holding N.V., Veldhoven (NL)

( * ) Notice: Subject to any disclaimer, the term of this patent is extended or adjusted under 35 U.S.C. 154(b) by 69 days.

(21) Appl. No.: 17/796,640

(22) PCT Filed: Jan. 21, 2021

(86) PCT No.: PCT/EP2021/051340
§ 371 (c)(1),
(2) Date: Jul. 29, 2022

(87) PCT Pub. No.: WO2021/151775
PCT Pub. Date: Aug. 5, 2021

(65) Prior Publication Data
US 2023/0059471 A1 Feb. 23, 2023

Related U.S. Application Data

(60) Provisional application No. 62/967,106, filed on Jan. 29, 2020.

(51) Int. Cl.
*G03F 7/00* (2006.01)
*G03F 9/00* (2006.01)

(52) U.S. Cl.
CPC ........ *G03F 7/70633* (2013.01); *G03F 9/7088* (2013.01)

(58) Field of Classification Search
CPC ............ G03F 7/70616; G03F 7/70625; G03F 7/70633; G03F 9/7065; G03F 9/7088;
(Continued)

(56) References Cited

U.S. PATENT DOCUMENTS

| 11,150,563 B2 | 10/2021 | Sokolov et al. |
| 2004/0263860 A1 | 12/2004 | Johnson |

(Continued)

FOREIGN PATENT DOCUMENTS

| EP | 1 628 164 A2 | 2/2006 |
| TW | 202032283 A | 9/2020 |
| WO | WO 2021/058571 A1 | 4/2021 |

OTHER PUBLICATIONS

International Search Report and Written Opinion of the International Searching Authority directed to related International Patent Application No. PCT/EP2021/051340, mailed Apr. 28, 2021; 10 pages.

(Continued)

*Primary Examiner* — Deoram Persaud
(74) *Attorney, Agent, or Firm* — Sterne, Kessler, Goldstein & Fox P.L.L.C.

(57) ABSTRACT

A compact sensor apparatus having an illumination beam, a beam shaping system, a polarization modulation system, a beam projection system, and a signal detection system. The beam shaping system is configured to shape an illumination beam generated from the illumination system and generate a flat top beam spot of the illumination beam over a wavelength range from 400 nm to 2000 nm. The polarization modulation system is configured to provide tenability of linear polarization state of the illumination beam. The beam projection system is configured to project the flat top beam spot toward a target, such as an alignment mark on a substrate. The signal detection system is configured to collect a signal beam comprising diffraction order sub- (Continued)

beams generated from the target, and measure a characteristic (e.g., overlay) of the target based on the signal beam.

15 Claims, 8 Drawing Sheets

(58) Field of Classification Search
CPC .................. G03F 9/7096; B60R 13/02; B60R 2013/0287; B60H 1/2226; B60H 1/2227; B60H 2001/2268; B29C 43/36; B29C 44/42; B29C 44/58; B29C 65/48
See application file for complete search history.

(56) References Cited

U.S. PATENT DOCUMENTS

| | | |
|---|---|---|
| 2007/0002336 A1 | 1/2007 | Pellemans et al. |
| 2014/0253891 A1 | 9/2014 | Den Boef et al. |
| 2017/0082932 A1 | 3/2017 | Fu et al. |
| 2017/0205342 A1 | 7/2017 | Krishnan et al. |
| 2019/0003981 A1 | 1/2019 | Van Voorst et al. |
| 2019/0302570 A1 | 10/2019 | Kumar et al. |
| 2022/0283516 A1* | 9/2022 | Swillam ............... G02B 6/1225 |

OTHER PUBLICATIONS

Fukui et al., "On Ghost Imaging Using Multimode Fiber and Integrated Optical Phased Array," IEEE 24th OptoElectronics and Communications Conference (OECC) and International Conference on Photonics in Switching and Computing (PSC), Jul. 7, 2019; 3 pages.

* cited by examiner

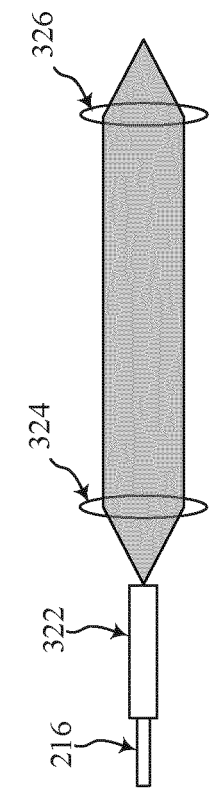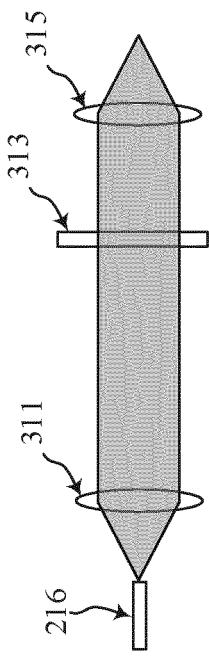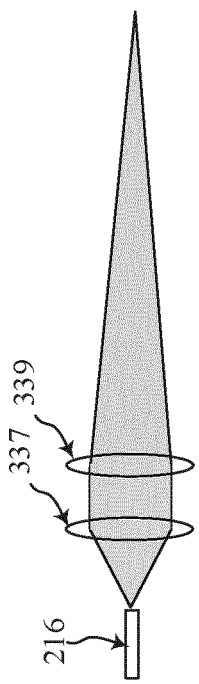

OPTICAL DESIGNS OF MINIATURIZED OVERLAY MEASUREMENT SYSTEM

CROSS-REFERENCE TO RELATED APPLICATIONS

This application claims priority of U.S. Provisional Patent Application No. 62/967,106, which was filed on Jan. 29, 2020, and which is incorporated herein in its entirety by reference.

FIELD

The present disclosure relates to optical sensor apparatuses and systems for overlay measurement, for example.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, one or more diffraction targets (e.g., alignment marks) are generally provided on, for example, the substrate, and the lithographic apparatus includes one or more overlay sensors by which overlay errors (e.g., due to the interaction between sensors) or on-process accuracy errors (OPAEs), based on varying stack thicknesses, materials, and/or processes on each wafer (e.g., process variations), can be measured accurately utilizing the diffraction target (e.g., micro diffraction-based overlay).

Compact optical systems can provide reduced hardware complexity, cost efficiency, and scalability since hundreds of sensors can be implemented on the same common platform. Integration of components (e.g., illumination source, fibers, mirrors, lenses, waveguides, detectors, processor, etc.) can provide a miniaturized optical sensor for measuring a particular characteristic (e.g., overlay, etc.) of an alignment mark on a substrate. Additionally, multiple alignment marks of the same substrate can be investigated by multiple paralleled sensors (e.g., sensor array) and different measurements can be conducted simultaneously or in real-time.

Accordingly, there is a need to achieve such compactness in the optical illumination and collection systems in a sensor apparatus, and provide a compact sensor system that is scalable and capable of measuring micro diffraction-based overlay precisely.

SUMMARY

In some embodiments, a compact sensor apparatus including an illumination beam, a beam shaping system, a polarization modulation system, a beam projection system, and a signal detection system is disclosed. The beam shaping system is configured to shape an illumination beam generated from the illumination system and generate a flat top beam spot of the illumination beam over a wavelength range from 400 nm to 2000 nm. The polarization modulation system is configured to provide tunability of linear polarization state of the illumination beam. The beam projection system is configured to project the flat top beam spot toward a target, such as an alignment mark on a substrate. The signal detection system is configured to collect a signal beam comprising diffraction order sub-beams generated from the target, and measure a characteristic (e.g., overlay) of the target based on the signal beam One aspect of the present disclosure provide a sensor apparatus, comprising: a beam shaping system configured to shape an illumination beam generated from an illumination system and generate a flat top beam spot of the illumination beam; a beam projection system configured to project the flat top beam spot toward a target on a substrate; and a signal detection system configured to collect a signal beam comprising diffraction order sub-beams generated from the target, and measure a characteristic of the target based on the collected signal beam.

In some embodiments, the target is an alignment mark on the substrate, and the characteristic of the target is an overlay measurement.

In some embodiments, a size of a cross sectional plane of the sensor apparatus perpendicular to an optical axil of the sensor apparatus is no greater than about 5 mm by 5 mm.

In some embodiments, the flat top beam spot of the illumination beam is over a wavelength range from 400 nm to 2000 nm.

In some embodiments, the illumination system comprises a photonic crystal fiber coupled to the beam shaping system.

In some embodiments, the beam shaping system comprises a collimator lens, a spatial light modulator, and a focusing lens.

In some embodiments, the beam shaping system comprises a photonic element coupled to the photonic crystal fiber, a collimator lens, a focusing lens.

In some embodiments, the photonic element is a square core photonic crystal waveguide comprising a same bandgap as the photonic crystal fiber.

In some embodiments, the beam shaping system comprises a collimator lens and an aspheric beam shaper.

In some embodiments, the sensor apparatus further comprises a polarization modulation system arranged after the beam shaping system, and configured to provide tunability of linear polarization state of the illumination beam.

In some embodiments, the polarization modulation system comprises a fixed linear polarizer, a quarter wave plate, and a rotatable linear polarizer.

In some embodiments, the polarization modulation system comprises a fixed linear polarizer, and a rotatable half waveplate.

In some embodiments, the signal detection system comprises a central lens, a reflector, and a signal detector.

In some embodiments, the central lens is a common component shared by the beam projection system and the signal detection system.

In some embodiments, the beam projection system comprises a field stop, a diffraction grating, two reflecting surfaces on the central lens, two concave mirrors, and a mechanical shutter.

In some embodiments, the beam projection system comprises a field stop, a collimator lens, an aperture stop, a beam splitter, two flat mirrors, two reflecting surfaces on the central lens, two concave mirrors, and a mechanical shutter.

In some embodiments, the beam projection system comprises a field stop, a collimator lens, an aperture stop, a beam splitter, a first pair of flat mirrors, two concave mirrors, a second pair of flat mirrors, and a mechanical shutter.

Another aspect of the present disclosure provides a method for correcting a processing error of a lithographic apparatus, comprising: measuring, by a plurality of sensors, characteristics of a plurality of targets on a substrate, each sensor comprising: a beam shaping system configured to shape an illumination beam generated from an illumination system and generate a flat top beam spot of the illumination beam; a beam projection system configured to project the flat top beam spot toward a target on the substrate; and a signal detection system configured to collect a signal beam comprising diffraction order sub-beams generated from the target, and measure a characteristic of the target based on the collected signal beam; determining, by a processor coupled to the plurality of sensors, the characteristics of the plurality of targets; and correcting the processing error of the lithographic apparatus or the substrate based on the characteristics of the plurality of targets.

In some embodiments, the method further comprises shaping the illumination beam by using a Fourier transformer, or a photonic element, or a aspheric lens in the beam shaping system.

In some embodiments, the method further comprises using a lens comprising reflective surfaces as a common component of both the beam projection system and the signal detection system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 3A to 3C illustrate schematics of three implementations of a beam shaping system in the sensor apparatus of FIG. 2, according to some exemplary embodiments.

Figure 1:
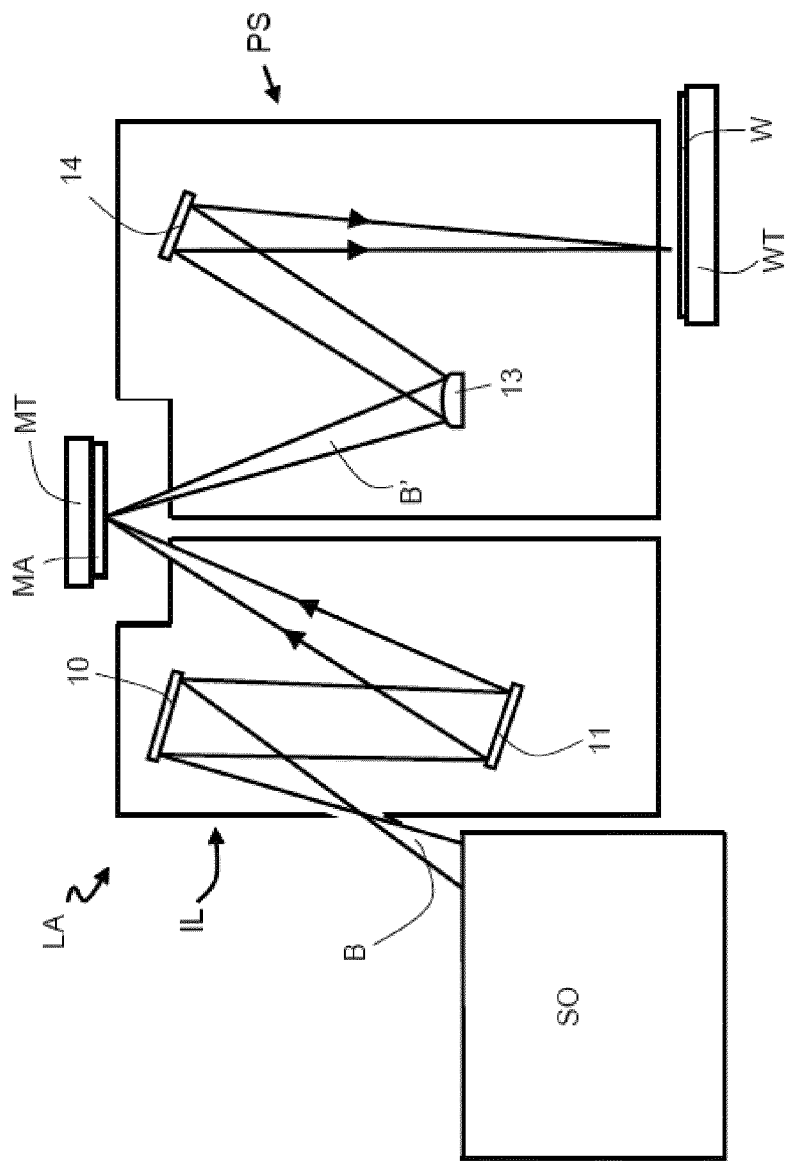
FIG. 1 is a schematic illustration of a lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Sensor Apparatus

As discussed above, on-process accuracy errors (OPAEs) are caused by varying stack thicknesses, materials, and/or processes on each wafer (i.e., process variations) and overlay errors due to the interaction between sensors. Process variations change the optical properties of reflected light from an alignment mark on a substrate, which causes OPAEs. Despite various techniques, such as mark asymmetry reconstruction (MAR), which corrects for asymmetries in an alignment mark, improved sensors, and predictive modeling, wafer stack properties variations (i.e., process variations) cause a lower limit for OPAEs and cannot be reduced further using current techniques and systems.

The disclosed compact sensor systems can provide reduced hardware complexity, better accuracy, cost efficiency, and scalability. Compact sensors, on the order of about 2 mm×2 mm, implemented on the same common platform (e.g., 20 mm×100 mm) can form a sensor array of hundreds of sensors. These miniaturized sensors (e.g., 2 mm×2 mm) can measure a particular characteristic (e.g., overlay error, OPAE, etc.) of an alignment mark on a substrate.

Also, integration of components (e.g., illumination source, fibers, mirrors, lenses, detector, processor, etc.) in a single sensor apparatus can improve miniaturization. Further, an integrated lens can be utilized to further reduce size restraints of collection systems for diffraction-based measurements. Additionally, multiple alignment marks of the same substrate can be investigated by multiple sensors (e.g., sensor array) and different measurements can be conducted simultaneously or in real-time.

Figure 2:
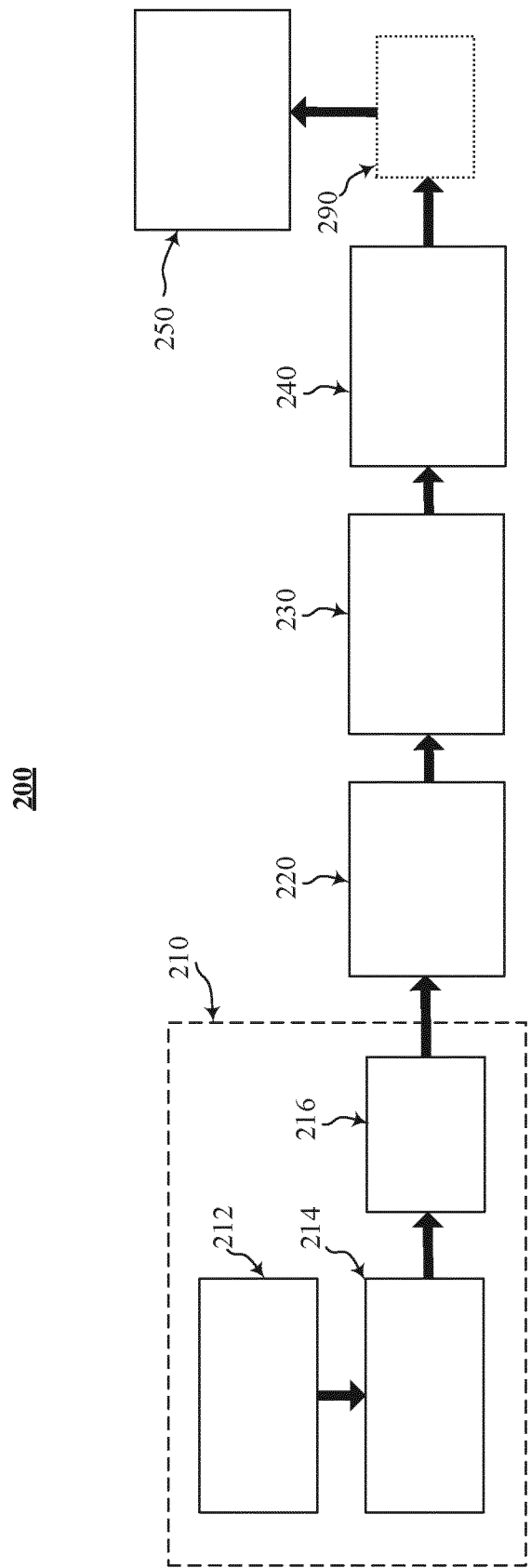
FIG. 2 is illustrates a schematic of sensor apparatus, according to an exemplary embodiment.

FIG. 2 illustrates a schematic of sensor apparatus 200, according to an exemplary embodiment. Sensor apparatus 200 is configured to measure a characteristic (e.g., overlay error, OPAE, etc.) of diffraction target 204 on substrate 202 and can correct a processing error (e.g., OPAE, etc.) and improve overlay, for example, in lithographic apparatus LA.

Sensor apparatus 200 can include illumination system 210, beam shaping system 220, polarization modulation system 230, beam projection system 240, and signal detection system 250. Although sensor apparatus 200 is shown in FIG. 2 as a stand-alone apparatus, the embodiments of this disclosure are not limited to this example, and sensor apparatus 200 embodiments of this disclosure can be used with or used in other optical systems, such as, but not limited to, lithographic apparatus LA and/or other optical systems.

Illumination system 210 can be configured to transmit illumination beam toward the beam shaping system 220. Illumination system 210 includes illumination source 212, illumination coupling 214, and photonic crystal fiber (PCF) 216. Illumination source 212 is produces illumination beam and is coupled to PCF 216 via illumination coupling 214, for example, a fiber optic cable.

The light source 212 can be configured to provide an electromagnetic broadband illumination beam having one or more passbands. In an example, the one or more passbands may be within a spectrum of wavelengths between about 400 nm to about 2000 nm. In an example, the one or more passbands may be within a spectrum of wavelengths between about 10 nm to about 700 nm. In another example, the one or more passbands may be within a spectrum of wavelengths between about 700 nm to about 2000 nm. Illumination system 210 can be further configured to provide one or more passbands having substantially constant center wavelength (CWL) values over a long period of time (e.g., over a lifetime of illumination system 210). Such configuration of illumination system 210 can help to prevent the shift of the actual CWL values from the desired CWL values, as discussed above, in current alignment systems. And, as a result, the use of constant CWL values may improve long-term stability and accuracy of sensor systems (e.g., sensor apparatus 200) compared to the current apparatuses.

In some embodiments, illumination system 210 can use a broadband light source (i.e., one with a wide range of light frequencies or wavelengths—and, thus, of colors) for a radiation source that may give a large etendue (i.e., spread of light, e.g., the product of the area (A) of the source and the solid angle (Ω) that the system's entrance pupil subtends as seen from the source), allowing the mixing of multiple wavelengths. In some embodiments, illumination beam 201 can include a plurality of wavelengths in the broadband and preferably may each have a bandwidth of Δλ and a spacing of at least 2Δλ (i.e., twice the bandwidth). In some embodiments, illumination system 210 can include several "sources" of radiation for different portions of an extended radiation source that have been split using fiber bundles. In this way, angle resolved scatter spectra can be measured at multiple wavelengths in parallel. For example, a 3-D spectrum (wavelength and two different angles) can be measured, which contains more information than a 2-D spectrum. This allows more information to be measured, which increases metrology process robustness. This is described in more detail in EP 1628164 A2, which is incorporated by reference herein in its entirety.

Photonic crystal fibers (PCFs) are a class of optical fiber based on properties of photonic crystals, which affect the motion of photons due to their periodic optical nanostructure, and are a subclass of microstructured optical fiber where photons are guided by structural modifications. PCFs are divided into two categories: (1) high index guiding fibers (e.g., solid core—high index core); and (2) low index guiding fibers (e.g., photonic bandgap (PBG)—low index core). A special class of low index guiding fibers includes hollow-core fibers, which are further divided into two categories: (1) PBG fibers; and (2) anti-resonance fibers (e.g., "negative curvature" core surround, anti-resonant nodeless tube-lattice fiber (ANF)). Photonic bandgap (PBG) fibers confine light by bandgap effects. Due to the highly periodic structure in the cladding, surrounding the core of the fiber, a photonic bandgap is created such that photons with frequencies within the PBG cannot propagate out through the cladding and are confined to the core.

PCF 216 can be configured to receive illumination beam from illumination coupling 214 and transmit illumination beam to beam shaping system 220. PCF 216 can be any suitable optical material capable of forming a photonic bandgap (PBG). For example, PCF 216 can be a semiconductor (e.g., Si, Ge, SiGe, GaAs, InP, etc.) or a dielectric. PCF 216 is coupled to beam shaping system 220. For example, an output port of PCF 216 is adjacent a collimator lens of beam shaping system 220, as described below.

Beam shaping system 220 can be configured to receive illumination beam from illumination system 210 and shape the illumination beam. For example, beam shaping system 220 can modulate the illumination beam from the output port of PCF 216 to provide a flat top beam spot with good homogeneity over wavelength range from 400 nm to 2000 nm. In some embodiments, beam shaping system 220 has a stringent compact size. FIGS. 3A to 3C illustrate schematics of three implementations of beam shaping system 220, according to some exemplary embodiments.

As shown in FIG. 3A, in one implementation, beam shaping system 220-1 can include collimator lens 311, spatial light modulator (SLM) 313, and focusing lens 315. Collimator lens 311 is arranged following the output of PCF 216 to transform illumination beam into a parallel light beam. SLM 315 is arranged following collimator lens 311, and is configured to modulate the intensity and/or the phase of the parallel light beam based on wavelength. SLM 315 and focusing lens 315 can form a Fourier transformer. As such, the polarization modulation system 220-1 can act as a configurable apodizer at pupil plane to obtain flat top beam spot for a given illumination profile. The pupil plane is the plane in which the radial position of radiation defines the angle of incidence and the angular position defines the azimuth angle of the radiation. It is noted that, polarization modulation system 220-1 can be achromatic and independent on incident beam profile. Optionally, a switch on/off illumination arm (not shown) can be arranged in polarization modulation system 220-1.

As shown in FIG. 3B, in another implementation, beam shaping system 220-2 can include photonic element 322, collimator lens 324, and focusing lens 326. Photonic element 322 is arranged connecting to the output of PCF 216 and is configured to generate reimaged top hat. For example, photonic element 322 can be a square core photonic crystal waveguide (PCW), or a fiber. Collimator lens 324 and focusing lens 326 can be arranged following photonic element 322 and are configured as relay lens. Such implementation can be extremely compact. Further, since the beam shaping is done by using photonic element 322, polarization modulation system 220-2 can be easy to design and fabricate.

As shown in FIG. 3C, in a third implementation, beam shaping system 220-3 can include collimator lens 337 and aspheric beam shaper 339. Collimator lens 337 is arranged following the output of PCF 216 to collimate incident illumination beam to a parallel light beam. In some embodiments, the parallel light beam can has a Gaussian distribution and has a beam waist about 0.5 mm at 1/e^2 that is constant across operational spectral band. Aspheric beam shaper 339 is arranged following collimator lens 311, and is configured to modulate the both wave front and spot profile of the parallel light beam. In some embodiments, aspheric beam shaper 339 can be a fused silica aspheric lens. A focusing length of aspheric beam shaper 339 can be in a range from 80 mm to 110 mm, such as about 100 mm. It is noted that, since controlling both wave front and spot profile makes the generated flat top beam spot very sensitive to wavelength, it is challenge to fabricate the aspheric lens surface to make the fused silica aspheric lens working in a broadband operation, and to eliminate the chromatic effects.

Figure 4B:
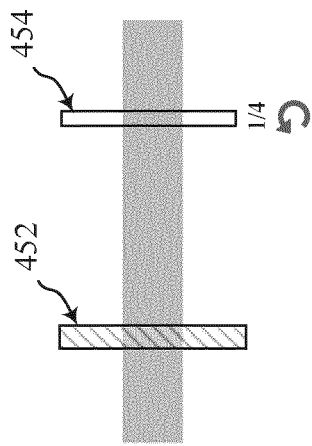
FIGS. 4A and 4B illustrate schematics of two implementations of a polarization modulation system in the sensor apparatus of FIG. 2, according to some exemplary embodiments.
Figure 4A:
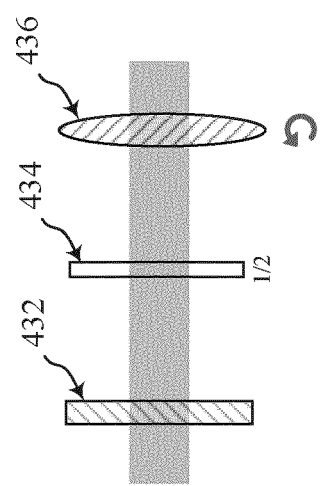

Polarization modulation system 230 can be arranged following beam shaping system 220, and be configured to provide tunability of linear polarization state of illumination beam. In some embodiments, polarization modulation system 230 can be any suitable polatization optics assembly. FIGS. 4A and 4B illustrate schematics of two implementations of polarization modulation system 230, according to some exemplary embodiments. As shown in FIG. 4A, in one implementation, polarization modulation system 230-1 can include fixed linear polarizer 432, quarter wave plate 434, and rotatable linear polarizer 436. Quarter wave plate 434 is arranged following fixed linear polarizer 432 and at 45 degree with respect to fixed linear polarizer 432. Rotatable linear polarizer 336 is arranged following quarter wave plate 434, and is configured to provide a linear polarizer at an arbitrary orientation in the plane orthogonal to the optical axis of polarization modulation system 230. In some embodiments, rotatable linear polarizer 436 can include a rotatable platform and a linear polarizer on the rotatable platform. As shown in FIG. 4B, in another implementation, polarization modulation system 230-2 can include fixed linear polarizer 452 and rotatable half waveplate 454.

Beam projection system 240 can be arranged following polarization modulation system 230, and be configured to receive and transmit polarized illumination beam toward target 290 on a substrate, and generate signal beam.

In some embodiments, target 290 can be an alignment mark on a substrate. In some embodiments, the substrate can be supported by a stage and centered along an alignment axis. In some embodiments, target 290 on the substrate can be a 1-D grating, which is printed such that after development, bars are formed of solid resist lines. In some embodiments, target 290 can be a 2-D array or grating, which is printed such that, after development, a grating is formed of solid resist pillars or vias in the resist. For example, bars, pillars, or vias may alternatively be etched into the substrate.

In some embodiments, signal beam can includes diffraction order sub-beams generated from target 290. For example, the signal beam can include a first diffraction order (e.g., 0) sub-beam, a second diffraction order (e.g., −1) sub-beam, and a third diffraction order (e.g., +1) sub-beam. The signal beam can be collected by signal detection system 250. Signal detection system 250 anbe configured to measure a characteristic of target 290 based on signal beam. In some embodiments, the characteristic of target 290 measured by signal detection system 250 is an overlay measurement (e.g., overlay error). In some embodiments, signal detection system 250 is coupled to a processor (not shown) configured to determine a processing error (e.g., overlay measurement, OPAE, etc.) based on the characteristic of target 290 detected by signal detection system 250.

Figure 5:
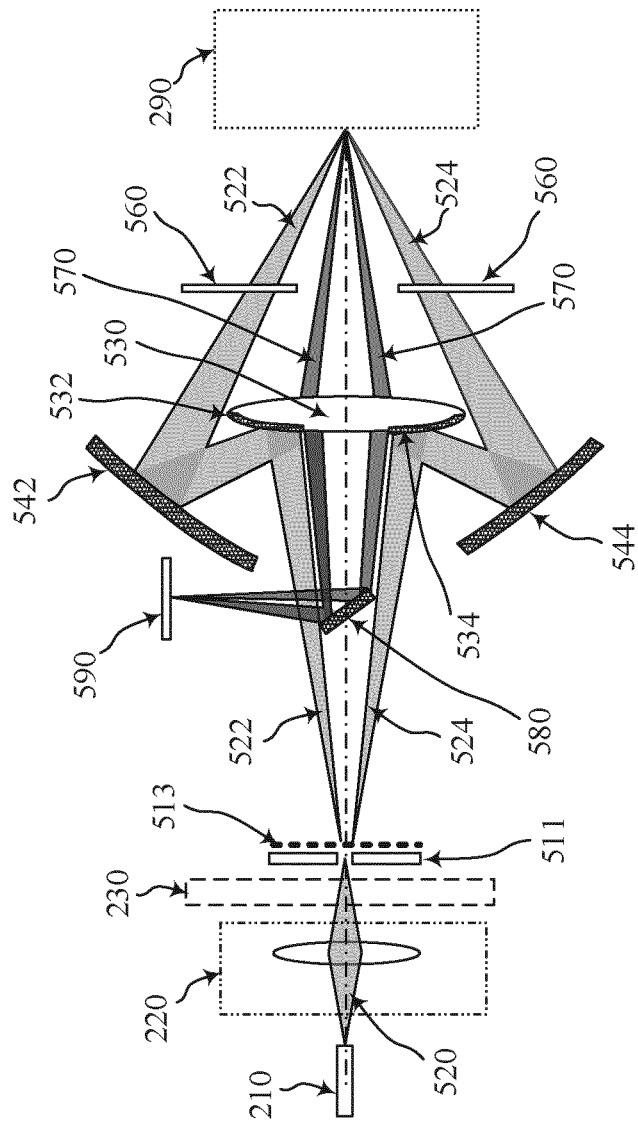
FIGS. 5-7 illustrate schematics of various implementations of the sensor apparatus of FIG. 2 using various beam projection systems, according to some exemplary embodiments.
Figure 6:
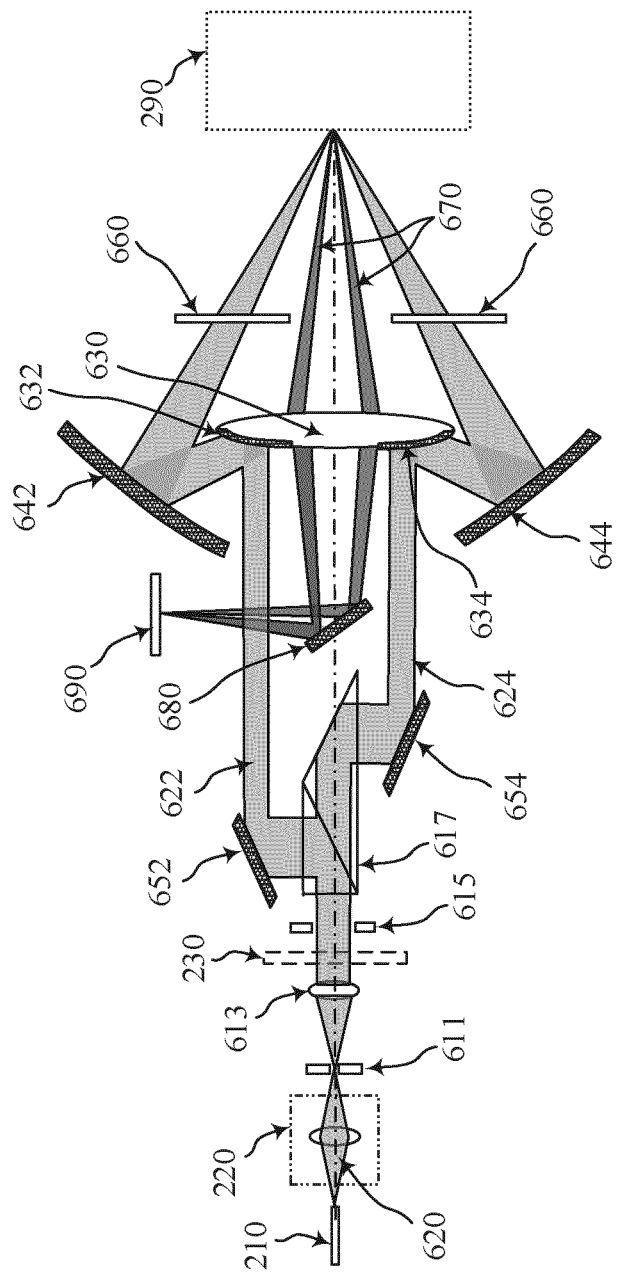
Figure 7:
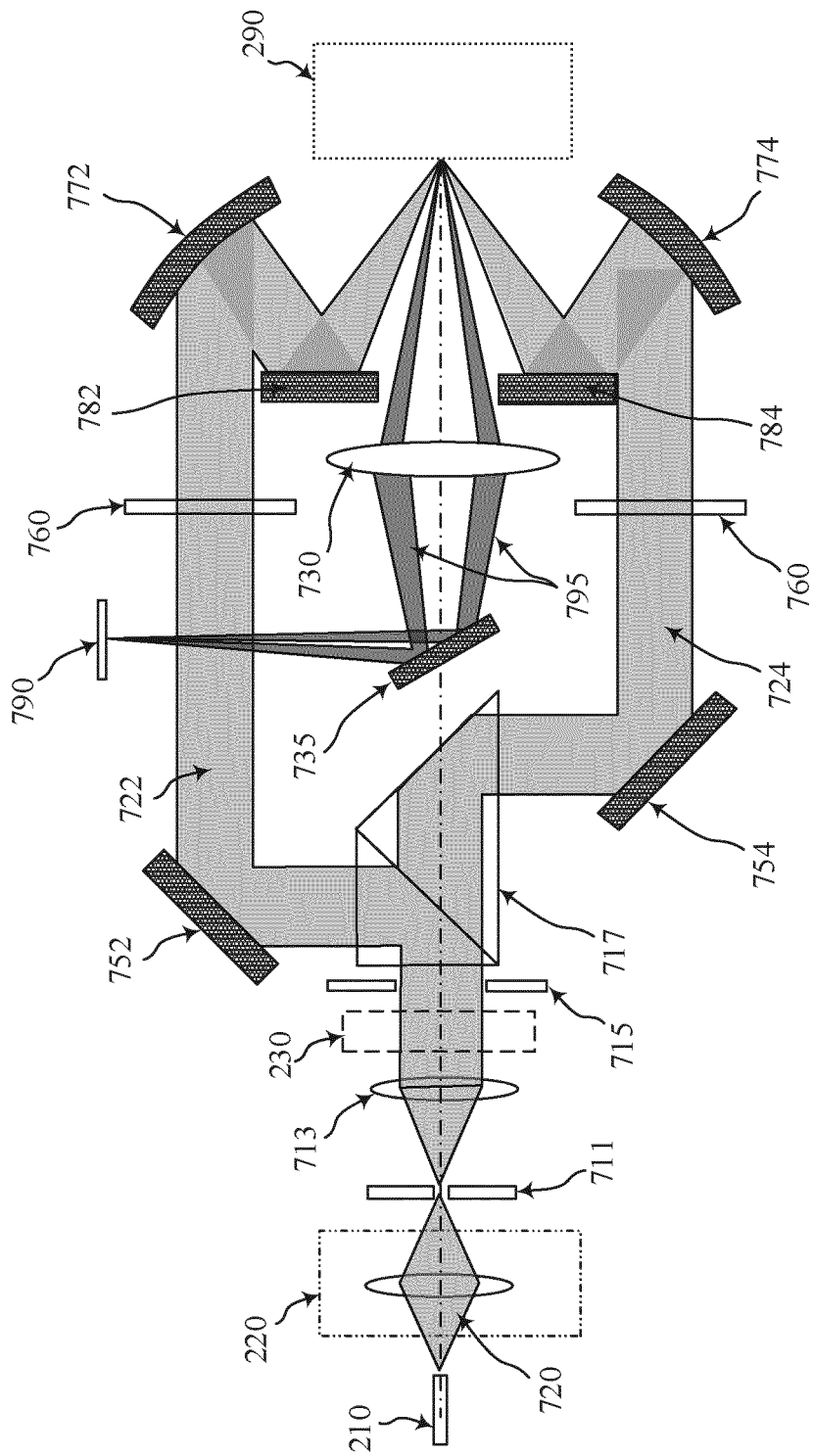

FIGS. 5-7 illustrate schematics of various implementations of sensor apparatus 200 using various beam projection systems 240, according to some exemplary embodiments.

Referring to a first implementation of sensor apparatus 200-1 as shown in FIG. 5, illumination beam 520 can be generated from illumination system 210, go through beam shaping system 220 and polarization modulation system 230 as described above. It is noted that, beam shaping system 220 can be any one of the three implementations 220-1, 220-2 and 220-3 described above in connection with FIGS. 3A-3C, and polarization modulation system 230 can be any one of the two implementations 230-1 and 230-2 described above in connection with FIGS. 4A-4B.

After beam shaping and polarization modulating, illumination beam 520 can go through field stop 511 and diffraction grating 513, and split into a first illumination sub-beam 522, and a second illumination sub-beam 524, as shown in FIG. 5.

The illumination sub-beams 522 and 524 can be reflected by two reflecting surfaces 532 and 534 on central lens 530 respectively, and then be reflected by two concave mirrors 542 and 544 respectively. The two concave mirrors 542 and 544 can be angled, parabolic, or elliptical mirrors. It is noted that, the reflecting surface 532 of central lens 530 and concave mirror 542 can form a first freeform aplanatic Schwarzchild telescope to focus the first sub-beam 522 to target 290, and reflecting surface 534 of central lens 530 and concave mirror 544 can form a second freeform aplanatic Schwarzchild telescope to focus the second sub-beam 524 to target 290. A mechanical shutter 560 can be arranged in the optical paths of first sub-beam 522 and second sub-beam 524 to alternatively control the two illumination channels on/off. The mechanical shutter 560 can be implemented using any suitable integrated optics.

The signal beam 570 including diffraction order sub-beams generated from target 290 can be focused by central lens 530 and then reflected by reflector 580 to signal detector 590. In some embodiments, signal detector 590 can be a camera. As described above, since beam shaping system 220 provides a flat top beam spot over side wavelength range covering the whole operating band of sensor apparatus 200, the potential displacement included inaccurate in the measuring the difference in the intensity of diffraction order (e.g., + and −) sub-beams can be avoid.

As shown in FIG. 5, field stop 511, diffraction grating 513, reflecting surfaces 532 and 534 of central lens 530, concave mirrors 542 and 544, and mechanical shutter 560 can constitute the beam projection system 240, while central lens 530, reflector 580, and signal detector 590 can constitute the signal detection system 250. It is noted that, central lens 530 is shared by both the beam projection system 240 and the signal detection system 250.

Referring to a second implementation of sensor apparatus 200-2 as shown in FIG. 6, and comparing to the first implementation of sensor apparatus 200-1 described above, the differences include the components of beam projection system 240 arranged after beam shaping system 220 and before central lens 630 (530 shown in FIG. 5).

As shown in FIG. 6, after illumination beam 620 be shaped by shaping system 220, illumination beam 620 can go through field stop 611 and collimator lens 613 to form a parallel beam. The polarization of the parallel beam can be modulated by polarization modulation system 230 as described above. It is noted that, beam shaping system 220 can be any one of the three implementations 220-1, 220-2 and 220-3 described above in connection with FIGS. 3A-3C, and polarization modulation system 230 can be any one of the two implementations 230-1 and 230-2 described above in connection with FIGS. 4A-4B.

After polarization modulating, illumination beam 620 can go through aperture stop 615 and beam splitter 617, and split into a first illumination sub-beam 622, and a second illumination sub-beam 624, as shown in FIG. 6. The illumination sub-beams 622 and 624 can be reflected by two flat mirror 652 and 654 respectively, and then be reflected by two reflecting surfaces 632 and 634 on central lens 630 respectively, and then be reflected by two concave mirrors 642 and 644 respectively. The two concave mirrors 642 and 644 can be angled, parabolic, or elliptical mirrors. The reflecting surface 632 of central lens 630 and concave mirror 642 can form a first freeform aplanatic Schwarzchild telescope to focus the first sub-beam 622 to target 290, and reflecting surface 634 of central lens 630 and concave mirror 644 can form a second freeform aplanatic Schwarzchild telescope to focus the second sub-beam 624 to target 290. A mechanical shutter 660 can be arranged in the optical paths of first sub-beam 622 and second sub-beam 624 to alternatively control the two illumination channels on/off. The mechanical shutter 660 can be implemented using any suitable integrated optics.

The signal beam 670 including diffraction order sub-beams generated from target 290 can be focused by central lens 630 and then reflected by reflector 680 to signal detector 690. In some embodiments, signal detector 690 can be a camera. As described above, since beam shaping system 220 provides a flat top beam spot over side wavelength range covering the whole operating band of sensor apparatus 200, the potential displacement included inaccurate in the measuring the difference in the intensity of diffraction order (e.g., + and −) sub-beams can be avoid.

As shown in FIG. 6, field stop 611, collimator lens 613, aperture stop 615, beam splitter 617, flat mirrors 652 and 654, reflecting surfaces 632 and 634 of central lens 630, concave mirrors 642 and 644, and mechanical shutter 660 can constitute the beam projection system 240, while central lens 630, reflector 680, and signal detector 690 can constitute the signal detection system 250. It is noted that, polarization modulation system 230 is arranged between components of beam projection system 240, and central lens 630 is shared by both the beam projection system 240 and the signal detection system 250.

Referring to a third implementation of sensor apparatus 200-3 as shown in FIG. 7, and comparing to the second implementation of sensor apparatus 200-2 described above, the differences include the components of beam projection system 240 arranged after beam splitter 717 (617 shown in FIG. 6) and target 290.

As shown in FIG. 7, after illumination beam 720 be shaped by shaping system 220, illumination beam 720 can go through field stop 711 and collimator lens 713 to form a parallel beam. The polarization of the parallel beam can be modulated by polarization modulation system 230 as described above. It is noted that, beam shaping system 220 can be any one of the three implementations 220-1, 220-2 and 220-3 described above in connection with FIGS. 3A-3C, and polarization modulation system 230 can be any one of the two implementations 230-1 and 230-2 described above in connection with FIGS. 4A-4B.

After polarization modulating, illumination beam 720 can go through a aperture stop 715 and beam splitter 717, and split into a first illumination sub-beam 722, and a second illumination sub-beam 724, as shown in FIG. 7. Illumination sub-beams 722 and 724 can be reflected by a first pair of flat mirrors 752 and 754 respectively, and then be reflected by two concave mirrors 772 and 774 respectively, and then be reflected by a second pair of flat mirrors 782 and 784 respectively. The two concave mirrors 772 and 774 can be angled, parabolic, or elliptical mirrors. The concave mirror 772 and flat mirror 782 can form a first freeform aplanatic Schwarzchild telescope to focus the first sub-beam 722 to target 290, while concave mirror 774 and flat mirror 784 can form a second freeform aplanatic Schwarzchild telescope to focus the second sub-beam 724 to target 290. A mechanical shutter 760 can be arranged in the optical paths of first sub-beam 722 and second sub-beam 724 to alternatively control the two illumination channels on/off. The mechanical shutter 760 can be implemented using any suitable integrated optics.

The signal beam 795 including diffraction order sub-beams generated from target 290 can be focused by central lens 730 and then reflected by reflector 735 to signal detector 790. In some embodiments, signal detector 790 can be a camera. As described above, since beam shaping system 220 provides a flat top beam spot over side wavelength range covering the whole operating band of sensor apparatus 200, the potential displacement included inaccurate in the measuring the difference in the intensity of diffraction order (e.g., + and −) sub-beams can be avoid.

As shown in FIG. 7, field stop 711, collimator lens 713, aperture stop 715, beam splitter 717, first pair of flat mirrors 752 and 754, concave mirrors 772 and 774, second pair of flat mirrors 782 and 784, and mechanical shutter 760 can constitute the beam projection system 240, while central lens 730, reflector 735, and signal detector 790 can constitute the signal detection system 250. It is noted that, polarization modulation system 230 is arranged between components of beam projection system 240, and beam projection system 240 signal detection system 250 do not share component.

It is noted that, although various implementations of only a single sensor apparatus 200 is described above, multiple (e.g., 10×20, 10×40, 10×50, 20×50, etc.) sensor apparatuses 200 can be implemented in parallel on the same common platform to form a sensor array. As such, multiple alignment marks on a same substrate can be investigated by the sensor array and different measurements can be conducted simultaneously or in real-time. The disclosed sensor array can have a compact size of within about 20 mm×100 mm, and can provide reduced hardware complexity, better accuracy, cost efficiency, and scalability.

Exemplary Flow Diagram

Figure 8:
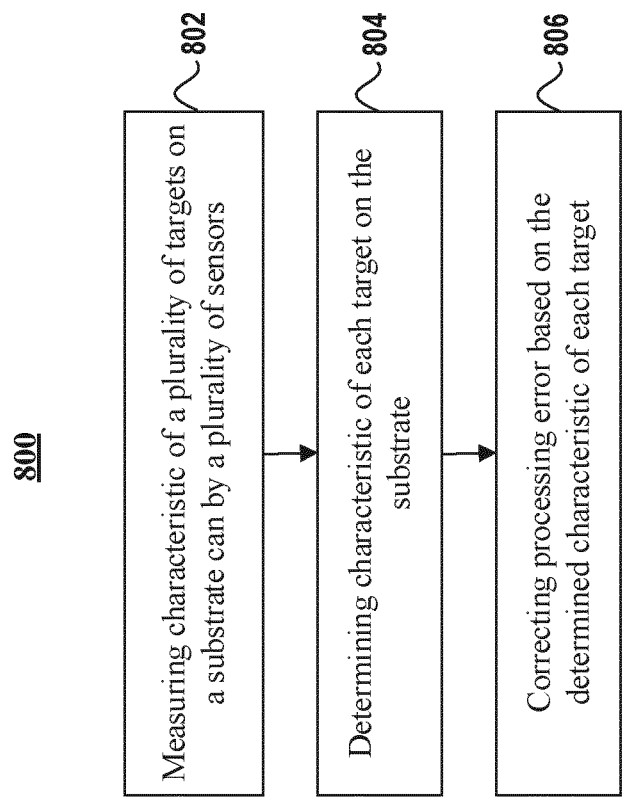
FIG. 8 illustrates a flow diagram for correcting a processing error, according to an exemplary embodiment.

FIG. 8 illustrates flow diagram 800 for correcting a processing error (e.g., overlay measurement, OPAE, etc.), according to some embodiments. It is to be appreciated that not all steps in FIG. 8 can be needed to perform the disclosure provided herein. Further, some of the steps may be performed simultaneously, or in a different order than shown in FIG. 8. Flow diagram 800 shall be described with reference to FIG. 2. However, flow diagram 800 is not limited to those example embodiments.

In step 802, a characteristic of a plurality of targets on a substrate can be measured with a plurality of sensors. For example, as shown in FIG. 2, the measurement of the characteristic of the plurality of targets 290 can by performed by an array of any disclosed implementation of sensor apparatuses 200 simultaneously or in real-time, for example, within 0.2 seconds.

In step 804, the characteristic of each target 204 on substrate can be determined by processor. For example, after detection of the characteristic of the plurality of targets 290 by the plurality of sensors apparatuses 200, the data may be received and processed by a processor.

In step 806, a processing error can be corrected based on the determined characteristic of each target. For example, the corrected processing error may be an overlay error of lithographic apparatus LA as shown in FIG. 1, sensor apparatus 200, and/or the substrate W.

In some embodiments, the characteristic of target 290 is an overlay measurement. In some embodiments, flow diagram 800 further includes, as shown in the examples of FIGS. 2, 3A-3C, 4A-4B, 5-7, adjusting one more optical components of the sensor apparatus 200, and subsequently repeating steps 802, 804, and 806 for an out-of-focus measurement, determination, and correction, respectively.

In some embodiments, the processor can feed corrections back to lithographic apparatus LA and/or sensor apparatus 200 for correcting errors, for example, in the overlay offset, for example, by feeding corrections into sensor apparatus 200 and/or the processor and processing substrate W using the corrected processing. Substrate W can be processed using known manufacturing processes by a lithographic projection apparatus, and a pattern (e.g., overlay marker or a product pattern in a reticle) can be imaged onto substrate W that is at least partially covered by a layer of radiation-sensitive material (resist). Prior to this imaging, substrate W can undergo various procedures, such as priming, resist coating, and a soft bake. Substrate W can be aligned in calibrated sensor apparatus 200 prior to exposure. After exposure, substrate W can be subjected to other procedures, such as a post-exposure bake (PEB), development, a hard bake, and measurement/inspection of the imaged features. Thus, substrate W can be exposed with an overlay marker along with a product pattern and the resist can be developed to print the overlay marker on the stacked wafer.

In some embodiments, the processor can measure printed pattern position offset error with respect to the sensor estimate for each alignment mark or target 290 on exposed substrate W. The measurement information includes but is not limited to the product stack profile, measurements of overlay, critical dimension, and/or focus of each alignment mark or target 290 on substrate W. The processor can utilize a clustering algorithm to group the marks into sets of similar constant offset errors, and create an overlay error offset correction table based on the information. The clustering algorithm may be based on overlay measurement, the position estimates, and/or additional optical stack process information associated with each set of offset errors. From this measured overlay and the known programmed overlay of its corresponding target, the overlay error can be deduced.

In some embodiments, the processor can determine corrections for each mark and feed corrections back to lithographic apparatus LA and/or sensor apparatus 200 for correcting errors in the overlay, for example, by feeding corrections into sensor apparatus 200. Thus, the process creates a self-learning feedback loop for calibrating sensor apparatus 200.

The embodiments may further be described using the following clauses:

1. A sensor apparatus, comprising:
   a beam shaping system configured to shape an illumination beam generated from an illumination system and generate a flat top beam spot of the illumination beam;
   a beam projection system configured to project the flat top beam spot toward a target on a substrate; and
   a signal detection system configured to collect a signal beam comprising diffraction order sub-beams generated from the target, and measure a characteristic of the target based on the collected signal beam.
2. The sensor apparatus of clause 1, wherein the target is an alignment mark on the substrate, and the characteristic of the target is an overlay measurement.
3. The sensor apparatus of clause 1, wherein a size of a cross sectional plane of the sensor apparatus perpendicular to an optical axil of the sensor apparatus is no greater than about 5 mm by 5 mm.
4. The sensor apparatus of clause 1, wherein the flat top beam spot of the illumination beam is over a wavelength range from 400 nm to 2000 nm.
5. The sensor apparatus of clause 1, wherein the illumination system comprises a photonic crystal fiber coupled to the beam shaping system.
6. The sensor apparatus of clause 1, wherein the beam shaping system comprises a collimator lens, a spatial light modulator, and a focusing lens.
7. The sensor apparatus of clause 5, wherein the beam shaping system comprises a photonic element coupled to the photonic crystal fiber, a collimator lens, a focusing lens.
8. The sensor apparatus of clause 7, wherein the photonic element is a square core photonic crystal waveguide comprising a same bandgap as the photonic crystal fiber.
9. The sensor apparatus of clause 1, wherein the beam shaping system comprises a collimator lens and an aspheric beam shaper.
10. The sensor apparatus of clause 1, further comprising a polarization modulation system arranged after the beam shaping system, and configured to provide tunability of linear polarization state of the illumination beam.
11. The sensor apparatus of clause 10, wherein the polarization modulation system comprises a fixed linear polarizer, a quarter wave plate, and a rotatable linear polarizer.
12. The sensor apparatus of clause 10, wherein the polarization modulation system comprises a fixed linear polarizer, and a rotatable half waveplate.
13. The sensor apparatus of clause 1, wherein the signal detection system comprises a central lens, a reflector, and a signal detector.
14. The sensor apparatus of clause 13, wherein the central lens is a common component shared by the beam projection system and the signal detection system.
15. The sensor apparatus of clause 14, wherein the beam projection system comprises a field stop, a diffraction grating, two reflecting surfaces on the central lens, two concave mirrors, and a mechanical shutter.
16. The sensor apparatus of clause 14, wherein the beam projection system comprises a field stop, a collimator lens, an aperture stop, a beam splitter, two flat mirrors, two reflecting surfaces on the central lens, two concave mirrors, and a mechanical shutter.
17. The sensor apparatus of clause 13, wherein the beam projection system comprises a field stop, a collimator lens, an aperture stop, a beam splitter, a first pair of flat mirrors, two concave mirrors, a second pair of flat mirrors, and a mechanical shutter.
18. A method for correcting a processing error of a lithographic apparatus, comprising:
    measuring, by a plurality of sensors, characteristics of a plurality of targets on a substrate, each sensor comprising:
       a beam shaping system configured to shape an illumination beam generated from an illumination system and generate a flat top beam spot of the illumination beam;
       a beam projection system configured to project the flat top beam spot toward a target on the substrate; and
       a signal detection system configured to collect a signal beam comprising diffraction order sub-beams generated from the target, and measure a characteristic of the target based on the collected signal beam;
    determining, by a processor coupled to the plurality of sensors, the characteristics of the plurality of targets; and
    correcting the processing error of the lithographic apparatus or the substrate based on the characteristics of the plurality of targets.
19. The method of clause 18, further comprising:
    shaping the illumination beam by using a Fourier transformer, or a photonic element, or a aspheric lens in the beam shaping system.
20. The method of clause 18, further comprising:
    using a lens comprising reflective surfaces as a common component of both the beam projection system and the signal detection system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A sensor apparatus, comprising:
    a beam shaping system configured to shape an illumination beam generated from an illumination system and to generate a flat top beam spot of the illumination beam;
    a beam projection system configured to project the flat top beam spot toward a target on a substrate; and
    a signal detection system configured to collect a signal beam comprising diffraction order sub-beams generated from the target and to measure a characteristic of the target based on the collected signal beam,
    wherein the beam shaping system comprises:
        a collimator lens, followed by a spatial light modulator, followed by a focusing lens; or
        a photonic element coupled to a photonic crystal fiber, followed by a collimator lens, followed by a focusing lens; or
        a collimator lens followed by an aspheric beam shaper.

2. The sensor apparatus of claim 1, wherein the target is an alignment mark on the substrate, and the characteristic of the target is an overlay measurement.

3. The sensor apparatus of claim 1, wherein a size of a cross sectional plane of the sensor apparatus perpendicular to an optical axil of the sensor apparatus is no greater than about 5 mm by 5 mm.

4. The sensor apparatus of claim 1, wherein the flat top beam spot of the illumination beam is over a wavelength range from 400 nm to 2000 nm.

5. The sensor apparatus of claim 1, wherein the illumination system comprises a photonic crystal fiber coupled to the beam shaping system.

6. The sensor apparatus of claim 1, wherein the photonic element is a square core photonic crystal waveguide comprising a same bandgap as the photonic crystal fiber.

7. The sensor apparatus of claim 1, further comprising a polarization modulation system arranged after the beam shaping system, and configured to provide tunability of a linear polarization state of the illumination beam.

8. The sensor apparatus of claim 7, wherein the polarization modulation system comprises a fixed linear polarizer, a quarter waveplate, and a rotatable linear polarizer.

9. The sensor apparatus of claim 7, wherein the polarization modulation system comprises a fixed linear polarizer, and a rotatable half waveplate.

10. A sensor apparatus, comprising:
a beam shaping system configured to shape an illumination beam generated from an illumination system and to generate a flat top beam spot of the illumination beam;
a beam projection system configured to project the flat top beam spot toward a target on a substrate; and
a signal detection system configured to collect a signal beam comprising diffraction order sub-beams generated from the target and to measure a characteristic of the target based on the collected signal beam,
wherein the signal detection system comprises a central lens, a reflector, and a signal detector,
wherein the central lens is a common component shared by the beam projection system and the signal detection system, and
wherein the beam projection system comprises a field stop, a diffraction grating, two reflecting surfaces on the central lens, two concave mirrors, and a mechanical shutter.

11. The sensor apparatus of claim 10, wherein the beam projection system comprises a field stop, a collimator lens, an aperture stop, a beam splitter, two flat mirrors, two reflecting surfaces on the central lens, two concave mirrors, and a mechanical shutter.

12. The sensor apparatus of claim 10, wherein the beam projection system comprises a field stop, a collimator lens, an aperture stop, a beam splitter, a first pair of flat mirrors, two concave mirrors, a second pair of flat mirrors, and a mechanical shutter.

13. A method for correcting a processing error of a lithographic apparatus, comprising:
generating an illumination beam having a flat top beam spot;
directing the flat top beam spot to a beam shaping system through:
a collimator lens, followed by a spatial light modulator, followed by a focusing lens;
or
a photonic element coupled to a photonic crystal fiber, followed by a collimator lens, followed by a focusing lens; or
directing the flat top beam spot through a collimator lens followed by an aspheric beam shaper;
projecting the flat top beam spot toward a target on a substrate;
collecting a signal beam comprising diffraction order sub-beams generated from the target;
determining a characteristic of the target; and
correcting the processing error of the lithographic apparatus based on the characteristic of the target.

14. The method of claim 13, further comprising:
shaping the illumination beam by using a Fourier transformer, a photonic element, or a aspheric lens in the beam shaping system.

15. The method of claim 13, further comprising:
using a lens comprising reflective surfaces as a common component for both the projecting and directing the flat top beam spot.

* * * * *

UNITED STATES PATENT AND TRADEMARK OFFICE
CERTIFICATE OF CORRECTION

PATENT NO. : 12,140,872 B2  
APPLICATION NO. : 17/796640  
DATED : November 12, 2024  
INVENTOR(S) : Swillam et al.

Page 1 of 1

It is certified that error appears in the above-identified patent and that said Letters Patent is hereby corrected as shown below:

On the Title Page

Column 2, Item (57), in "ABSTRACT", Line 8, delete "tenability" and insert -- tunability --, therefor.

Signed and Sealed this  
Fourth Day of March, 2025

Coke Morgan Stewart  
*Acting Director of the United States Patent and Trademark Office*